US010411120B2

(12) United States Patent
Chao et al.

(10) Patent No.: US 10,411,120 B2
(45) Date of Patent: Sep. 10, 2019

(54) SELF-ALIGNED INNER-SPACER REPLACEMENT PROCESS USING IMPLANTATION

(71) Applicant: International Business Machines Corporation, Armonk, NY (US)

(72) Inventors: Robin Hsin-Kuo Chao, Wappingers Falls, NY (US); Michael A. Guillorn, Cold Springs, NY (US); Chi-Chun Liu, Altamont, NY (US); Shogo Mochizuki, Clifton Park, NY (US); Chun W. Yeung, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/654,896

(22) Filed: Jul. 20, 2017

(65) Prior Publication Data
US 2018/0047835 A1    Feb. 15, 2018

Related U.S. Application Data

(62) Division of application No. 15/235,357, filed on Aug. 12, 2016, now Pat. No. 9,831,324.

(51) Int. Cl.
*H01L 29/66*    (2006.01)
*H01L 29/78*    (2006.01)
(Continued)

(52) U.S. Cl.
CPC .. *H01L 29/66818* (2013.01); *H01L 21/26513* (2013.01); *H01L 21/30604* (2013.01);
(Continued)

(58) Field of Classification Search
CPC .......... H01L 29/66818; H01L 29/7853; H01L 29/66553; H01L 29/0847; H01L 29/42392;
(Continued)

(56) References Cited

U.S. PATENT DOCUMENTS 4,835,112 A * 5/1989 Pfiester .................. H01L 21/22
                                                             438/305
6,297,115 B1 * 10/2001 Yu ...................... H01L 21/26506
                                                             438/305
(Continued)

FOREIGN PATENT DOCUMENTS

KR       20020033327 A    5/2002
KR    1020060077039 A    7/2006
(Continued)

OTHER PUBLICATIONS

English translation for Korean Application No. KR102002033327A.
List of IBM Patents or Patent Applications Treated as Related.

*Primary Examiner* — Bitew A Dinke
(74) *Attorney, Agent, or Firm* — Vazken Alexanian; Ryan, Mason & Lewis, LLP

(57) ABSTRACT

A method for manufacturing a semiconductor device includes forming a stacked configuration of first and second semiconductor layers on a semiconductor substrate, wherein the stacked configuration comprises a repeating arrangement of a second semiconductor layer stacked on a first semiconductor layer, forming a plurality of dummy gates spaced apart from each other on the stacked configuration, wherein the plurality of dummy gates cover a portion of the stacked configuration in a channel region, performing an implantation of a semiconductor material on exposed portions of the stacked configuration in a source/drain region, wherein the implantation increases a concentration of the semiconductor material in the exposed portions of the stacked configuration, and selectively removing first semiconductor layers having an increased concentration of the semiconductor material from the source/drain region, wherein the removed first semiconductor layers correspond in position to the first semiconductor layers in the channel region.

14 Claims, 7 Drawing Sheets

(51) Int. Cl.
  *H01L 29/06* (2006.01)
  *H01L 21/306* (2006.01)
  *H01L 21/265* (2006.01)
  *H01L 29/08* (2006.01)

(52) U.S. Cl.
  CPC ...... *H01L 29/0673* (2013.01); *H01L 29/0847* (2013.01); *H01L 29/66439* (2013.01); *H01L 29/66553* (2013.01); *H01L 29/7853* (2013.01)

(58) Field of Classification Search
  CPC ........... H01L 29/0649; H01L 29/78696; H01L 29/66742; H01L 29/78618; H01L 29/775; H01L 29/66439; H01L 29/1608; H01L 29/0673; B82Y 10/00
  See application file for complete search history.

(56) References Cited

U.S. PATENT DOCUMENTS

| | | | |
|---|---|---|---|
| 6,696,341 B1 * | 2/2004 | Sonoda | H01L 27/0266 438/285 |
| 6,743,689 B1 * | 6/2004 | Paton | H01L 21/26506 438/305 |
| 6,897,118 B1 * | 5/2005 | Poon | H01L 21/26513 438/303 |
| 7,112,499 B2 | 9/2006 | Poon et al. | |
| 7,323,419 B2 | 1/2008 | Jung et al. | |
| 7,494,856 B2 | 2/2009 | Zhang et al. | |
| 8,993,425 B2 | 3/2015 | Zhang | |
| 9,570,551 B1 * | 2/2017 | Balakrishnan | H01L 29/0673 |
| 9,583,399 B1 | 2/2017 | Chen et al. | |
| 9,831,324 B1 | 11/2017 | Chao et al. | |
| 2004/0063286 A1 | 4/2004 | Kim et al. | |
| 2004/0178406 A1 | 9/2004 | Chu | |
| 2005/0064686 A1 | 3/2005 | Chidambarrao et al. | |
| 2006/0014350 A1 * | 1/2006 | Wang | H01L 21/265 438/293 |
| 2006/0019478 A1 * | 1/2006 | Zhao | H01L 21/26506 438/583 |
| 2006/0105511 A1 | 5/2006 | Yang et al. | |
| 2008/0135949 A1 | 6/2008 | Lo et al. | |
| 2008/0179636 A1 | 7/2008 | Chidambarrao et al. | |
| 2009/0035911 A1 | 2/2009 | Rachmady et al. | |
| 2009/0042374 A1 | 2/2009 | Pawlak et al. | |
| 2009/0127584 A1 * | 5/2009 | Morand | H01L 29/42392 257/192 |
| 2009/0294807 A1 | 12/2009 | Yan et al. | |
| 2011/0003451 A1 | 1/2011 | Orlowski et al. | |
| 2011/0062417 A1 * | 3/2011 | Iwayama | B82Y 10/00 257/24 |
| 2011/0062421 A1 * | 3/2011 | Iwayama | B82Y 10/00 257/29 |
| 2014/0001441 A1 * | 1/2014 | Kim | H01L 29/0673 257/29 |
| 2014/0151639 A1 * | 6/2014 | Chang | H01L 29/42392 257/27 |
| 2014/0353718 A1 | 12/2014 | Loubet et al. | |
| 2015/0090958 A1 * | 4/2015 | Yang | H01L 29/0676 257/27 |
| 2015/0091091 A1 | 4/2015 | Liu | |
| 2015/0187584 A1 | 7/2015 | Zhang | |
| 2015/0243733 A1 | 8/2015 | Yang et al. | |
| 2015/0270340 A1 * | 9/2015 | Frank | H01L 29/0673 257/347 |
| 2015/0311286 A1 * | 10/2015 | Lee | H01L 29/1033 257/351 |
| 2015/0325648 A1 * | 11/2015 | Cea | H01L 29/42392 438/283 |
| 2015/0340457 A1 | 11/2015 | Xie et al. | |
| 2015/0364490 A1 | 12/2015 | Oda | |
| 2015/0372104 A1 | 12/2015 | Liu et al. | |
| 2015/0372115 A1 * | 12/2015 | Koh | H01L 29/6656 438/301 |
| 2015/0380557 A1 * | 12/2015 | Le | H01L 29/42392 257/190 |
| 2016/0013313 A1 | 1/2016 | Cheng et al. | |
| 2016/0027870 A1 * | 1/2016 | Cheng | H01L 29/0673 257/347 |
| 2016/0099338 A1 * | 4/2016 | Chang | H01L 21/3065 257/347 |
| 2016/0155800 A1 | 6/2016 | Zang et al. | |
| 2016/0172358 A1 * | 6/2016 | Hatcher | H01L 29/42392 257/401 |
| 2016/0276494 A1 * | 9/2016 | Barraud | H01L 29/78696 |
| 2017/0040321 A1 * | 2/2017 | Mitard | H01L 29/78684 |
| 2017/0110539 A1 * | 4/2017 | Krishnan | H01L 29/0673 |
| 2017/0110554 A1 * | 4/2017 | Tak | H01L 29/4991 |
| 2017/0141212 A1 * | 5/2017 | Barraud | H01L 21/02667 |
| 2017/0222024 A1 * | 8/2017 | Bergendahl | H01L 29/66712 |
| 2017/0271475 A1 * | 9/2017 | Chang | H01L 29/66545 |

FOREIGN PATENT DOCUMENTS

| | | |
|---|---|---|
| KR | 100783484 B1 | 12/2007 |
| WO | 2007082745 A1 | 7/2007 |

* cited by examiner

SELF-ALIGNED INNER-SPACER REPLACEMENT PROCESS USING IMPLANTATION

TECHNICAL FIELD

The field generally relates to semiconductor devices and methods of manufacturing same and, in particular, to controlling lateral wet etch depth by using implantation to introduce a self-aligned material difference between source/drain and channel regions.

BACKGROUND

A nanowire is a relatively thin wire, for example, with a diameter or width measured in nanometers (nm). Nanowires can have diameters or widths such as, for example, about 4 nm to 10 nm. Nanowire devices can be a viable device option instead of fin field-effect transistors (FinFETs). For example, a nanowire can be used as the fin structure in a dual-gate, tri-gate or gate-all-around (GAA) FET device. Nanowires can have a smaller perimeter than fins, but also larger external resistance due to an under-spacer component. Complementary metal-oxide semiconductor (CMOS) scaling can be enabled by the use of stacked nanowires, which offer superior electrostatics and higher current density per footprint area than FinFETs. In a stacked nanosheet GAA FET process flow, inner-spacer replacement can be an important process to reduce capacitance and prevent leakage between gate and source/drain (S/D) regions.

SUMMARY

According to an exemplary embodiment of the present invention, a method for manufacturing a semiconductor device includes forming a stacked configuration of silicon germanium and silicon layers on a semiconductor substrate, wherein the stacked configuration comprises a repeating arrangement of a silicon layer stacked on a silicon germanium layer, forming a plurality of dummy gates spaced apart from each other on the stacked configuration, wherein the plurality of dummy gates cover a portion of the stacked configuration in a channel region, performing a germanium implantation on exposed portions of the stacked configuration in a source/drain region, wherein the germanium implantation increases a germanium concentration of the exposed portions of the stacked configuration, and selectively removing silicon germanium layers having increased germanium concentration from the source/drain region, wherein the removed silicon germanium layers correspond in position to the silicon germanium layers in the channel region.

According to an exemplary embodiment of the present invention, a semiconductor device includes a plurality of nanowires formed in a stacked configuration in a channel region on a semiconductor substrate, a plurality of gates spaced apart from each other on the stacked configuration, a plurality of channel extension layers in a source/drain region, each of the plurality of channel extension layers respectively corresponding to and positioned adjacent a nanowire of the plurality of nanowires in the stacked configuration, wherein each of the plurality of channel extension layers has a higher germanium concentration than its corresponding nanowire, a spacer layer formed under each channel extension layer in the source/drain region.

According to an exemplary embodiment of the present invention, a method for manufacturing a semiconductor device includes forming a stacked configuration of first and second semiconductor layers on a semiconductor substrate, wherein the stacked configuration comprises a repeating arrangement of a second semiconductor layer stacked on a first semiconductor layer, forming a plurality of dummy gates spaced apart from each other on the stacked configuration, wherein the plurality of dummy gates cover a portion of the stacked configuration in a channel region, performing an implantation of a semiconductor material on exposed portions of the stacked configuration in a source/drain region, wherein the implantation increases a concentration of the semiconductor material in the exposed portions of the stacked configuration, and selectively removing first semiconductor layers having an increased concentration of the semiconductor material from the source/drain region, wherein the removed first semiconductor layers correspond in position to the first semiconductor layers in the channel region.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 2:
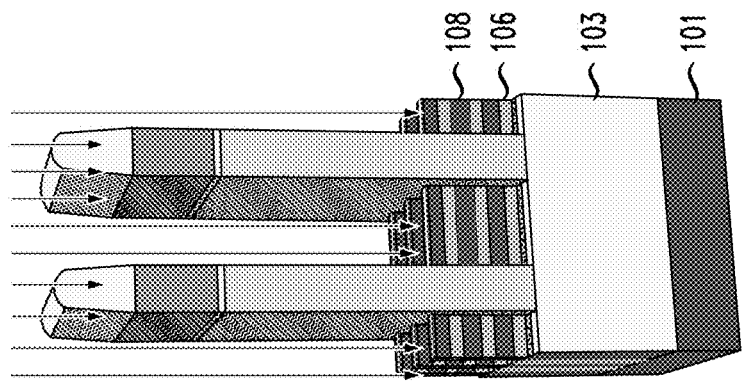
FIG. 2 is a three-dimensional view illustrating fabrication of a semiconductor device, and showing an implantation process into stacked nanosheet structure, according to an exemplary embodiment of the present invention.

Exemplary embodiments of the invention will now be discussed in further detail with regard to semiconductor devices and methods of manufacturing same and, in particular, to controlling lateral wet etch depth by using implantation to introduce a self-aligned material difference between source/drain and channel regions.

It is to be understood that the various layers and/or regions shown in the accompanying drawings are not drawn to scale, and that one or more layers and/or regions of a type commonly used in, for example, complementary metal-oxide semiconductor (CMOS), nanowire field-effect transistor (FET), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, nanowire FETs, CMOSs, MOSFETs and/or FinFETs. By way of non-limiting example, the semiconductor devices can include, but are not limited to nanowire FET, CMOS, MOSFET and FinFET devices, and/or semiconductor devices that use CMOS, MOSFET and/or FinFET technology.

As used herein, "height" refers to a vertical size of an element (e.g., a layer, trench, hole, opening, etc.) in the three-dimensional views measured from a bottom surface to a top surface of the element, and/or measured with respect to a surface on which the element is located. Conversely, a "depth" refers to a vertical size of an element (e.g., a layer, trench, hole, opening, etc.) in the three-dimensional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the three-dimensional views, and "horizontal" refers to a direction parallel to the top surface of the substrate in the three-dimensional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, a "nanosheet" can refer to alternating layers in any width and length of a conductor channel material and a sacrificial layer of any material, both before and after removal.

Inner-spacer replacement during stacked nanosheet processing may result in curved or crescent shaped semiconductor layers undercutting channel layers in a channel region of a transistor, causing unwanted gate to source/drain (S/D) region shorts and increased parasitic capacitance. The curved or crescent shape can be caused by an inability to control over-etching of sacrificial semiconductor layers in a stacked nanosheet structure. For example, during a timed wet etch process of the sacrificial semiconductor layers, over-etching into the channel region is difficult to control due to a lack of etch selectivity between the sacrificial semiconductor material in the S/D and channel regions.

According to an embodiment of the present invention, during processing to replace an inner spacer, lateral wet etch depth is controlled by using implantation of a semiconductor material to introduce a self-aligned material difference between source/drain and channel regions, which functions as an etch stop to prevent over-etching of sacrificial semiconductor layers into a channel region. As a result, yield can be significantly improved by preventing gate to S/D shorts and reducing parasitic capacitance.

The three-dimensional views of FIGS. 1, 2, 3A, 3B, 4, 5, 6A, 6B and 7 illustrate a gate extension direction substantially into the page, and a nanowire extension direction in substantially left and right directions on the page.

Figure 1:
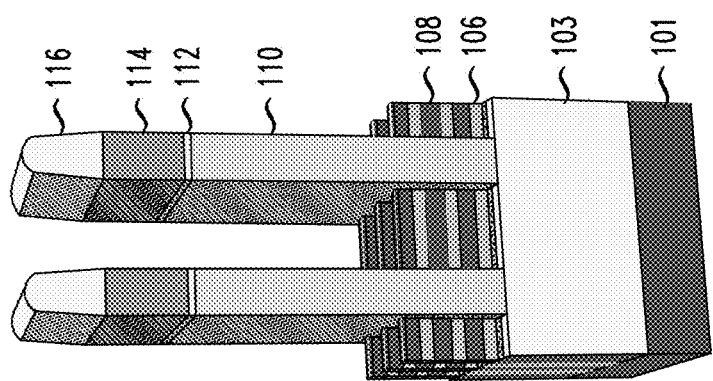
FIG. 1 is a three-dimensional view illustrating fabrication of a semiconductor device, and showing formation of dummy gate structures around a plurality of stacked nanosheet structures, according to an exemplary embodiment of the present invention.

FIG. 1 is a three-dimensional view illustrating fabrication of a semiconductor device, and showing formation of dummy gate structures around a plurality of stacked nanosheet structures, according to an exemplary embodiment of the present invention. Referring to FIG. 1, a semiconductor substrate 101 comprises semiconductor material including, but not limited to, silicon (Si), silicon germanium (SiGe), silicon carbide (SiC), silicon germanium carbide (SiGeC), III-V, II-V compound semiconductor or other like semiconductor. In addition, multiple layers of the semiconductor materials can be used as the semiconductor material of the substrate.

In accordance with an embodiment of the present invention, the substrate 101 comprises silicon, and layers of silicon germanium 106 and silicon 108 are epitaxially grown in an alternating and stacked configuration, so that a first SiGe layer 106 is followed a first Si layer 108 on the first SiGe layer, which is followed by a second SiGe layer 106 on the first Si layer 108, and so on. While three SiGe layers 106 and three Si layers 108 are shown, the embodiments of the present invention are not necessarily limited to the shown number of layers 106, 108, and there may be more or less layers in the same alternating configuration depending on design constraints.

Referring to FIG. 1, in a non-limiting illustrative embodiment, a first SiGe layer 106 of a SiGe/Si nanosheet stack is formed on the substrate 101 by epitaxial growth. In accordance with an embodiment of the present invention, the layers 106 include, for example, germanium at a 25% concentration, but are not necessarily limited thereto. Other concentrations of germanium can also be used. In a non-limiting illustrative embodiment, a height of the layers 106 can be in the range of about 6 nm-about 15 nm depending on the application of the device. Alternative materials may be used that have the property of being removed selectively compared to the nanowire channel material.

In a non-limiting illustrative embodiment, a first silicon layer 108 of the SiGe/Si nanosheet stack is formed on the first SiGe layer 106 by epitaxial growth. In accordance with an embodiment of the present invention, the layers 108 include the same or a similar composition to the substrate 101. In a non-limiting example, a height of the layers 108 can be in the range of about 8 nm-about 12 nm depending on the desired process and application.

Additional SiGe and silicon layers 106, 108 in a stacked configuration to form the remaining SiGe and silicon layers 106, 108 of the SiGe/Si nanosheet stack, are formed on the first (lower) silicon layer 108 by epitaxial growth. In accordance with an embodiment of the present invention, each of the layers 106 has the same or substantially the same composition and size as each other, and each of the layers 108 has the same or substantially the same composition and size as each other.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from about 550° C. to about 900° C. Although higher temperature typically results in faster deposition, the faster deposition may result in crystal defects and film cracking.

A number of different sources may be used for the epitaxial growth of the SiGe and Si layers 106, 108. In some embodiments, a gas source for the deposition of epitaxial semiconductor material includes a silicon containing gas source, a germanium containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In accordance with an embodiment of the present invention, the epitaxial growth is performed by growing layers 106, 108, each of which has a height (in the vertical direction in the figures) of between approximately 5 nm and approximately 25 nm. According to an embodiment, approximately between 3 and 5 pairs of layers 106, 108 are formed.

In accordance with an embodiment of the present invention, the nanosheet stacks of layers 106 and 108 can be patterned by, for example, lithography and dry etching, such as, for example, an isotropic etching process, such as reactive ion etching (ME) to form a plurality of patterned nanosheet stacks spaced apart from each other. For example, referring to FIGS. 1 and 2, three nanosheet stacks are spaced apart from each other going into the page. The etching is performed using an ME process and a mask including, for example, a nitride, oxide, or an organic resist, covering what is to be a remaining portion of SiGe/Si layers.

Figure 6B:
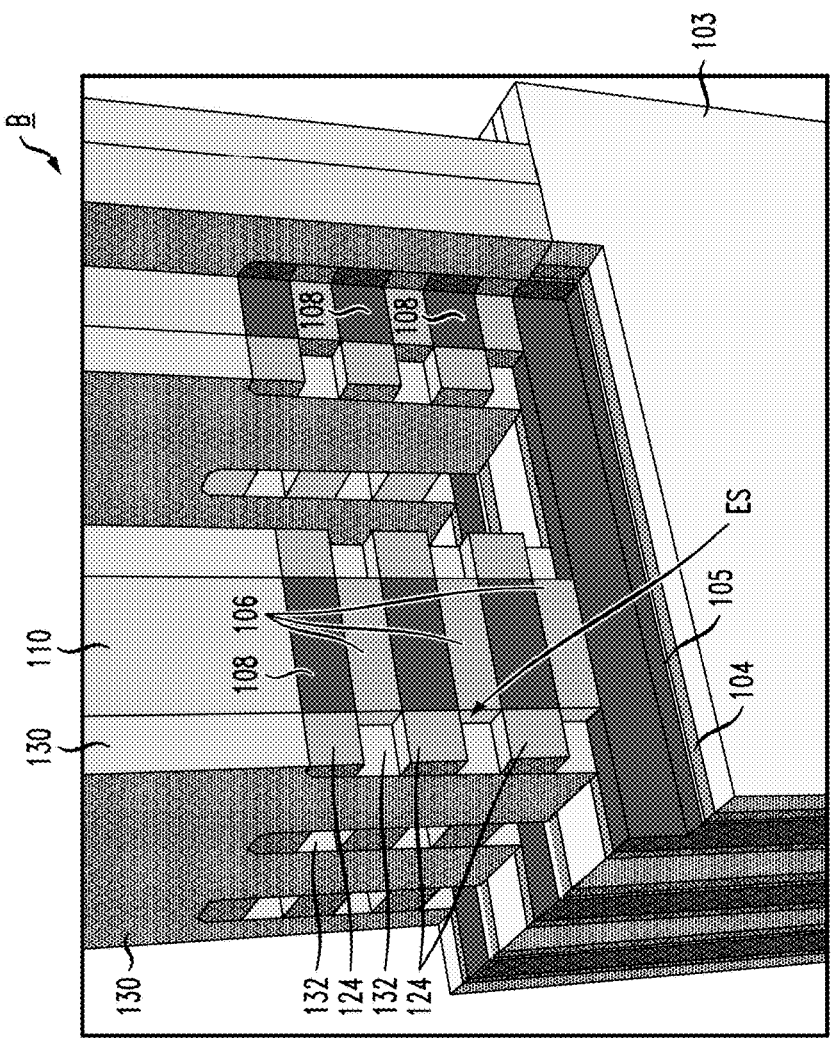
FIGS. 6A and 6B are three-dimensional views illustrating fabrication of a semiconductor device, and showing selective removal of sacrificial semiconductor layers from the stacked nanosheet structures, according to an exemplary embodiment of the present invention.

Isolation regions, for example, shallow trench isolation (STI) regions, are formed on the substrate 101 between the patterned nanosheet stacks. In accordance with an embodiment of the present invention, portions of the substrate 101 are etched to form trenches in the substrate 101, in which a dielectric material, including, but not limited to silicon dioxide ($SiO_2$), low-temperature oxide (LTO), high-temperature oxide (HTO), flowable oxide (FOX) or some other dielectric, is deposited to form isolation regions 103, such as, for example, STI regions. The dielectric material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating, followed by a planarization process, such as, CMP to remove excess isolation material. Referring to FIG. 6B, dielectric layers 104 and 105 (e.g., oxide and nitride layers) are formed between portions of the substrate 101 and isolation regions 103.

Referring to FIG. 1, dummy gate material, including, but not necessarily limited to, polysilicon, amorphous silicon, or a dielectric material such as, for example, oxide or silicon nitride, is deposited on the substrate 101 including the patterned stacks including SiGe and silicon layers 106 and 108 using deposition techniques such as, for example, CVD, PECVD, RFCVD, PVD, ALD, MBD, PLD, and/or LSMCD, sputtering, and/or plating, followed by a planarization process, such as, chemical mechanical planarization (CMP), and lithography and etching steps to remove excess dummy gate material, and pattern the deposited layers into dummy gates 110.

Dielectric and hard mask layers 112, 114 and 116 are formed on top of the dummy gates 110, which can be formed by one or more the deposition techniques noted in connection with deposition of the dummy gate material. The dielectric and hard mask materials can comprise for example, silicon oxide, silicon nitride, silicon oxynitride, boron nitride, silicon boron nitride, or multilayered stacks thereof. According to an embodiment, the dielectric layer 112 comprises an oxide, and the hard mask layers 114 and 116 respectively comprise a nitride and an oxide.

Figure 3B:
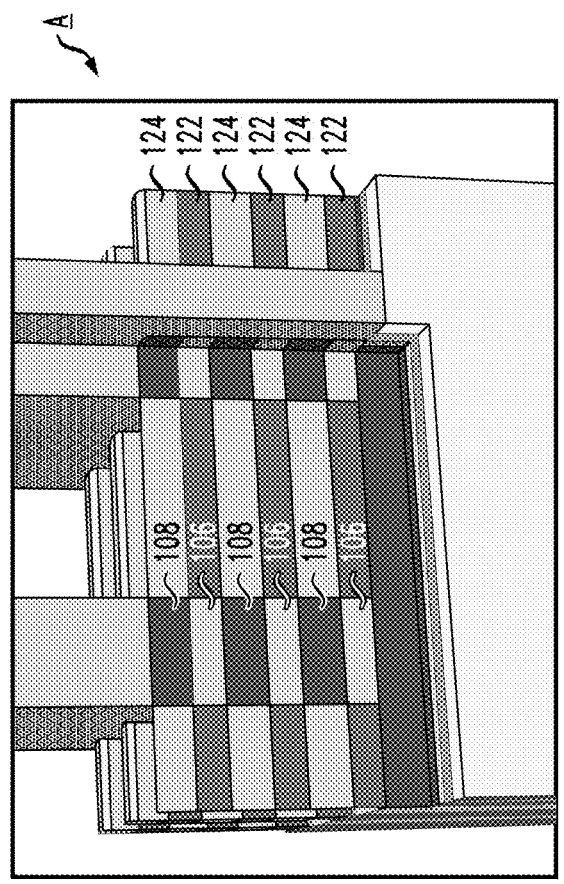
FIGS. 3A and 3B are three-dimensional views illustrating fabrication of a semiconductor device, and showing results of an implantation process, according to an exemplary embodiment of the present invention.
Figure 3A:
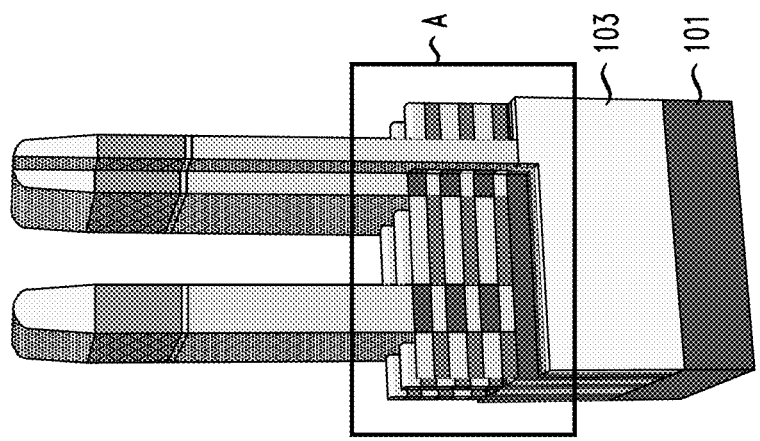

FIG. 2 is a three-dimensional view illustrating fabrication of a semiconductor device, and showing an implantation process into stacked nanosheet structures, according to an exemplary embodiment of the present invention. FIGS. 3A and 3B are three-dimensional views showing results of the implantation process, according to an exemplary embodiment of the present invention. Referring to FIG. 2, as shown by arrows, a germanium implantation process is performed in order to increase the germanium concentration of exposed layers 106, 108 of the patterned nanosheet stacks. As can be seen in FIGS. 3A and 3B, the germanium implantation creates a self-aligned selective etch layer between the nanosheet in a channel region and the S/D region to reduce the lateral meniscus into the channel region. The implantation creates layers 122 and 124 in the S/D regions outside the channel regions, where layers 122 and 124 have increased germanium concentrations when compared with layers 106 and 108, respectively. In accordance with a non-limiting illustrative embodiment of the present invention, the germanium concentration of layers 122 and 124 is increased by at least 5%. By way of example, an SiGe layer 106 having a silicon concentration of 75% and germanium concentration of 25% is modified to an SiGe layer 122 in the S/D regions having a silicon concentration of 70% and a germanium concentration of 30%, and a silicon layer 108 is modified to an SiGe layer 124 in the S/D regions having a silicon concentration of 95% and a germanium concentration of 5%. The noted initial concentrations and concentrations after implantation are by way of example only, and the embodiments of the present invention are not necessarily limited thereto. As noted above, the embodiments of the present invention contemplate an increase in germanium concentration in the layers in the source/drain regions after implantation, of for example, 5% or more.

As can be seen in FIGS. 3A and 3B, during the implantation process, the dummy gates 110 function as block masks to prevent a change in germanium concentration for the layers 106 and 108 in the channel regions that are covered by the dummy gates 110. Given the result of using the dummy gates 110 as block masks, different materials with different etch rates that are self-aligned with the channel and source/drain regions are created. The enhanced etch selectivity by these materials enables a self-aligned process that improves yield by controlling lateral etch depth so that etching of the sacrificial layers 122 stops upon reaching the SiGe layer 106 in the channel region, thereby preventing formation of a curved replacement inner spacer that undercuts a channel layer.

When performing etching, using, for example, $NH_4OH$:$H_2O_2$ solution, etching rates (e.g., nm/min) can increase by one order of magnitude (e.g., 10 times) for every 20% increase in germanium concentration. As a result, due to the higher concentration of germanium in layers 122 with respect to layers 106, 108 and 124, etching of the sacrificial layers 122 can be performed selective to layers 106, 108 and 124, such that etching stops once the sacrificial layers 122 are removed from the S/D regions upon reaching the SiGe layers 106 in the channel region. As will explained further with reference to FIGS. 6A and 6B, the SiGe layers 106 having a different germanium concentration from the layers 122 operate as etch stops, which prevent curvature formation in the layers 106 that would have undercut the channel layers 108.

Figure 8A:
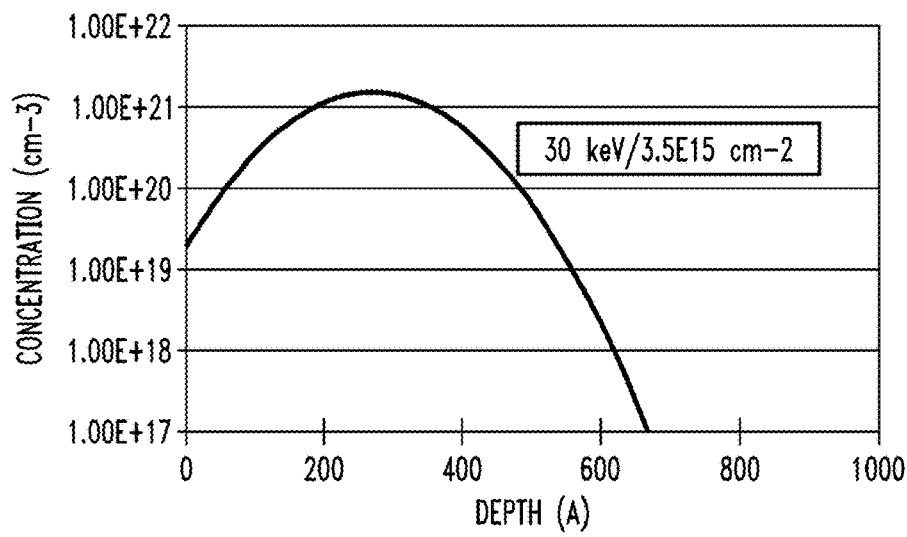
FIGS. 8A and 8B are graphs illustrating concentration as a function of depth for a single implantation and multiple implantations, respectively, of a material in a stacked nanosheet structure, according to an exemplary embodiment of the present invention.
Figure 8B:
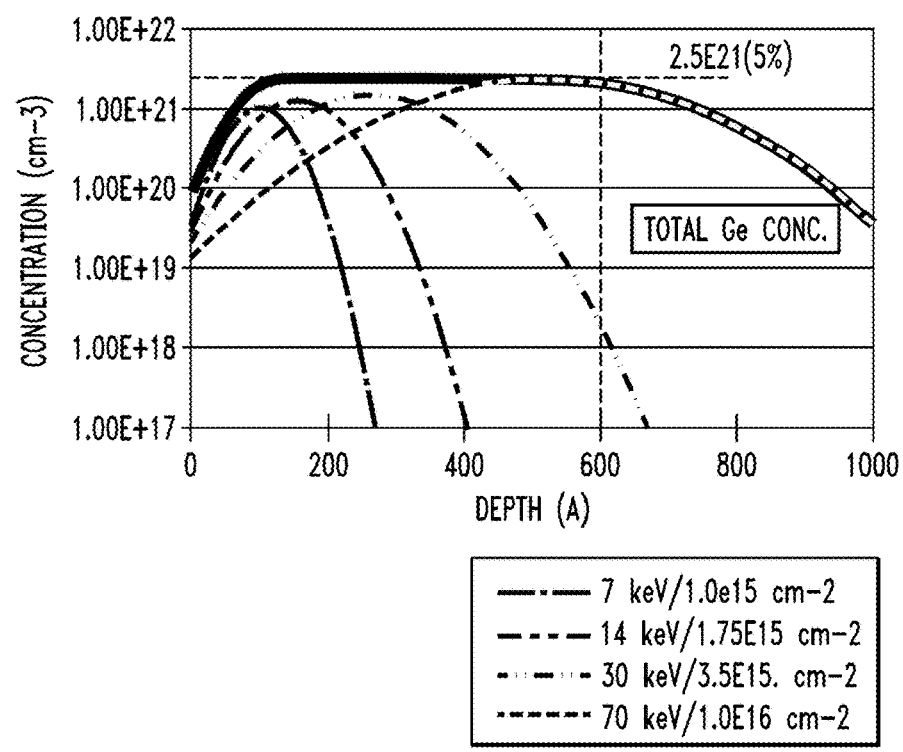

According to a non-limiting illustrative embodiment of the present invention, FIGS. 8A and 8B are graphs illustrating germanium concentration in a stacked nanosheet structure as a function of depth for a single implantation and multiple implantations, respectively. As can be seen with reference to FIG. 8B, a uniform concentration of germanium can be achieved over a predetermined depth range of nanosheet layers by performing multiple implantations. For example, as shown by the thicker curve in FIG. 8B, which represents a result of the combination of the multiple implantations (thinner curves) in FIG. 8B, a substantially uniform increase in material concentration (in this case about 5% increase in germanium concentration) can be achieved over a depth range of about 600 angstroms. Accordingly, in accordance with an embodiment of the present invention, the implantation process discussed in connection with FIGS. 2, 3A and 3B occurs in multiple steps to implant the material (e.g., germanium), wherein each step is performed at a different energy level, such as 7 keV/ 1.0E15 $cm^{-2}$, 14 keV/1.75E15 $cm^{-2}$, 30 keV/3.5E15 $cm^{-2}$, and 70 keV/1.0E156 $cm^{-2}$. Further, in accordance with an embodiment of the present invention, the amorphization (e.g., conversion into an amorphous layer) of the channel extension layers (e.g., layers 124) can be avoided by utilizing hot implant technique, whereby the implantation in accordance with an embodiment of the present invention, is performed at a high temperature, such as, for example, greater than 400° C.

Figure 9B:
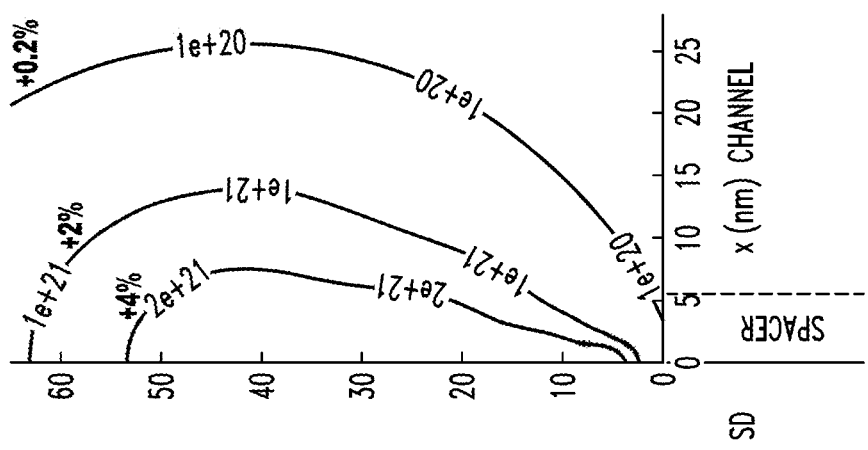
FIGS. 9A and 9B are graphs illustrating expected lateral germanium implantation concentration due to straggling and generated germanium composition, according to an exemplary embodiment of the present invention.
Figure 9A:
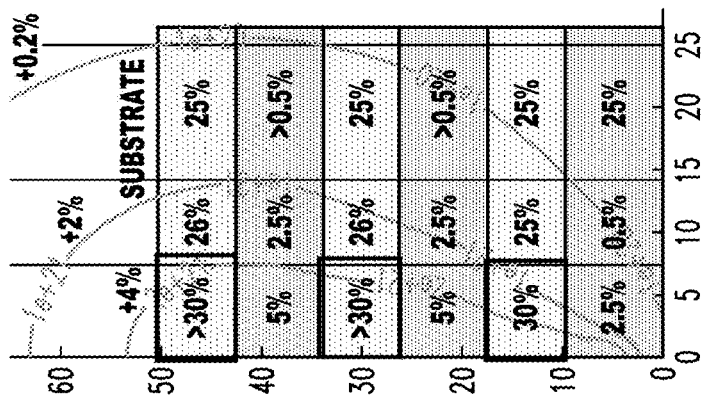

FIGS. 9A and 9B are graphs illustrating expected lateral Ge implantation concentration due to straggling and the Ge composition generated by an embodiment of the present invention in a nanosheet stack under a gate spacer and a dummy gate for desired wet etch selectivity.

Figure 4:
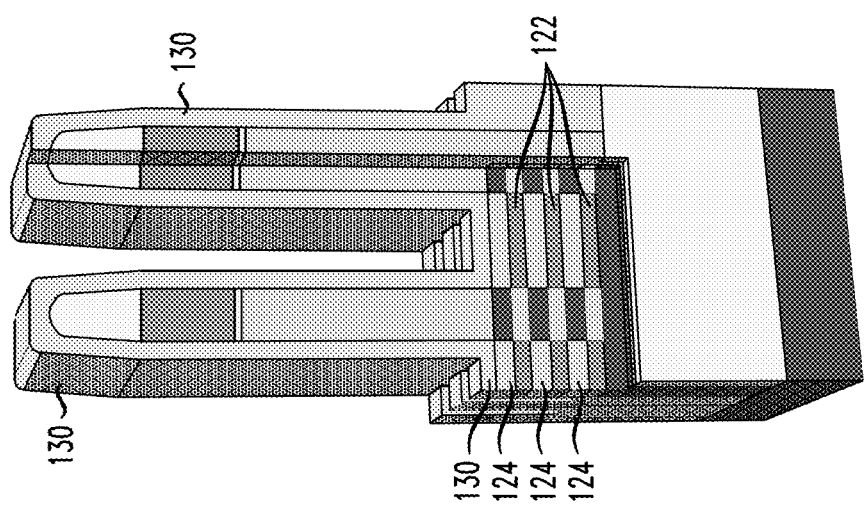
FIG. 4 is a three-dimensional view illustrating fabrication of a semiconductor device, and showing a first spacer deposition, according to an exemplary embodiment of the present invention.

FIG. 4 is a three-dimensional view illustrating fabrication of a semiconductor device, and showing a first spacer deposition, according to an exemplary embodiment of the present invention. Referring to FIG. 4, a dielectric, such as, for example, silicon oxide, silicon nitride, silicon oxynitride, boron nitride, silicon boron nitride, or multilayered stacks thereof, is deposited conformally on the nanosheet stacks, as well on sidewalls of the dummy gates 110 and dielectric and hardmask layers 112, 114 and 116, and on a top surface of the hardmask layer 116 to form spacers 130. Deposition of the spacer material can be performed using one or more conformal deposition techniques including, but not necessarily limited to, CVD or ALD.

Figure 5:
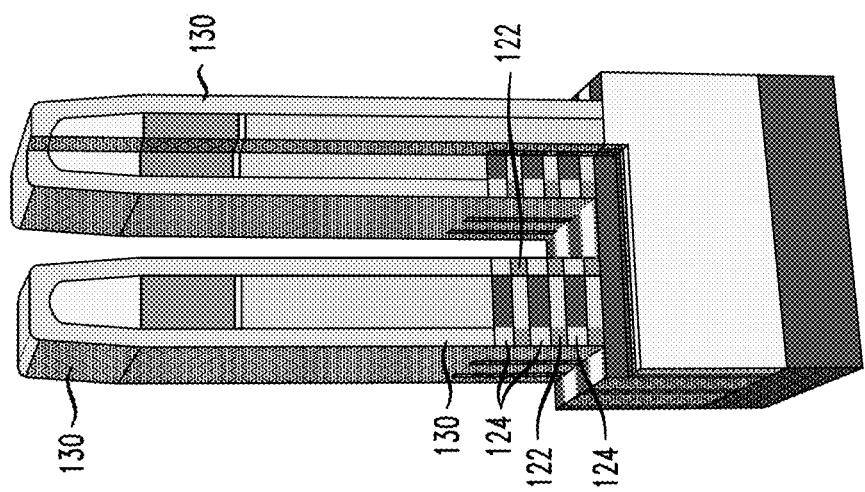
FIG. 5 is a three-dimensional view illustrating fabrication of a semiconductor device, and showing recessing of source/drain regions, according to an exemplary embodiment of the present invention.

FIG. 5 is a three-dimensional view illustrating fabrication of a semiconductor device, and showing recessing of source/drain regions, according to an exemplary embodiment of the present invention. Referring to FIG. 5, portions of the stacked nanosheets in the source/drain regions including a spacer layer 130 on a top surface thereof, are removed using, for example, an isotropic etching process, such as RIE. As can be seen in FIG. 5, the spacer layer 130 on the sidewalls of the dummy gates 110 and dielectric and hardmask layers 112, 114 and 116, and portions of the stacked nanosheets under the spacer layer 130 and under the dummy gates 110 remain after the isotropic etching process.

Figure 6A:
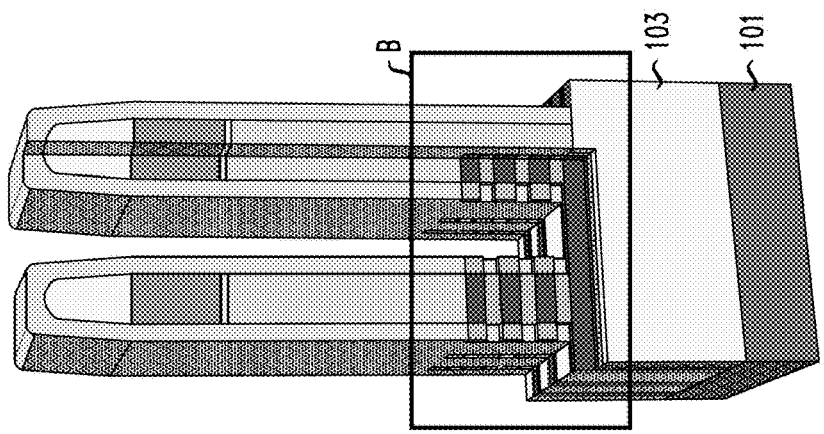

FIGS. 6A and 6B are three-dimensional views illustrating fabrication of a semiconductor device, and showing selective removal of sacrificial semiconductor layers from the stacked nanosheet structures, according to an exemplary embodiment of the present invention. As noted above, due to the higher concentration of germanium in layers 122 with respect to layers 106, 108 and 124, etching of the sacrificial layers 122 can be performed selective to layers 106, 108 and 124, such that etching stops once the sacrificial layers 122 are removed from the S/D regions upon reaching the SiGe layers 106 in the channel region. For example, as shown by arrow ES in FIG. 6B, the SiGe layers 106 having a different germanium concentration from the layers 122 operate as etch stops, which prevent curvature formation in the layers 106 that would have undercut the channel layers 108. In accordance with an embodiment of the present invention, the portions of the layers 122 under the spacers 130 in the S/D region are selectively removed, leaving vacant spaces 132 between remaining channel extension layers 124 and/or in line with layers 106. The faster rate of etching of the layers 122 having a higher germanium concentration enables the selective etching with respect to layers 106, 108 and 124 having a lower concentration of germanium. According to an embodiment of the present invention, the SiGe layers 122 have at least a 5% higher germanium concentration than SiGe layers 106. For example, SiGe layers 122 can have about 50% germanium concentration and SiGe layers 106 can have about 25% germanium concentration. As noted above, when performing etching, using, for example, $NH_4OH:H_2O_2$ solution, etching rates (e.g., nm/min) can increase by one order of magnitude for every 20% increase in germanium concentration.

Figure 7:
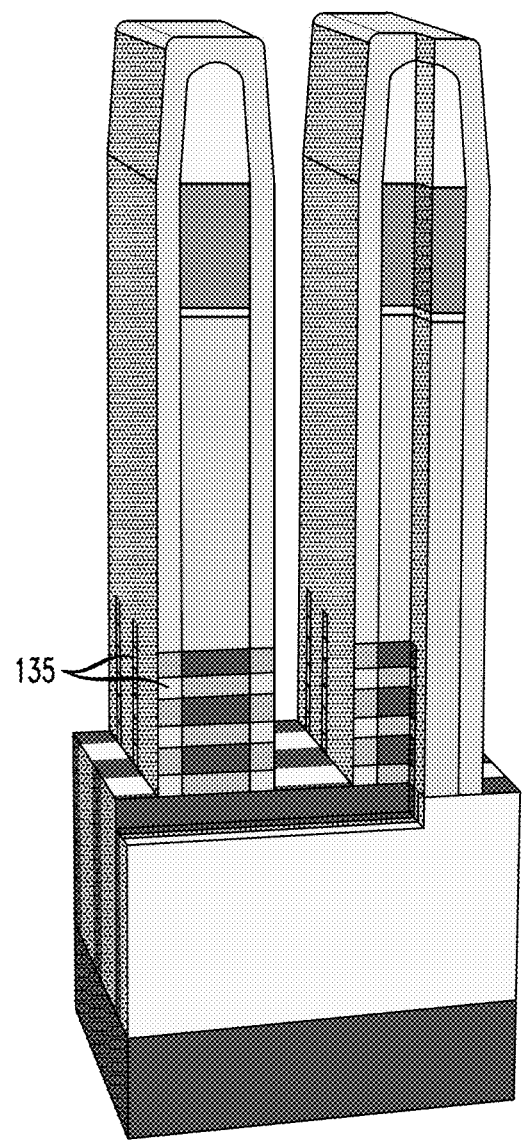
FIG. 7 is a three-dimensional view illustrating fabrication of a semiconductor device, and showing a second spacer deposition, according to an exemplary embodiment of the present invention.

FIG. 7 is a three-dimensional view illustrating fabrication of a semiconductor device, and showing a second spacer deposition, according to an exemplary embodiment of the present invention. Referring to FIG. 7, a dielectric, such as, for example, silicon oxide, silicon nitride, silicon oxynitride, boron nitride, silicon boron nitride, or multilayered stacks thereof, is deposited to form inner spacers 135 to fill in the gaps 132 left after etching the layers 122. The material of the spacers 135 can be the same or similar to the material of the spacers 130. Deposition of the spacers 135 can be performed using deposition techniques including, but not necessarily limited to, CVD, PECVD, RFCVD, PVD, ALD, MBD, PLD, and/or LSMCD, sputtering, and/or plating, followed by a wet etch process to remove excess deposited material of the spacers 135. The wet etch process may be performed using diluted high temperature phosphoric acid and hydrofluoric (HF) acid to remove excess materials.

Following deposition of the spacers 135, processing continues to remove the dummy gate, dielectric and hardmask layers 110, 112, 114, and 116 adjacent the spacers 130, and sacrificial layers 106 adjacent the spacers 135, followed by replacement metal gate (RMG) processing. The RMG processing can include, for example, deposition of a high-K dielectric, such as, for example, $HfO_2$ (hafnium oxide), and metals, such as, for example, tungsten, zirconium, tantalum, titanium, aluminum, ruthenium, metal carbides, metal nitrides, transition metal aluminides, tantalum carbide, titanium carbide, tantalum magnesium carbide, or combinations thereof. The metal gate structure may be formed using, for example, deposition techniques including, but not necessarily limited to, CVD, PECVD, RFCVD, PVD, ALD, MBD, PLD, and/or LSMCD, sputtering, and/or plating. The resulting gate structure can be planarized using, for example, CMP.

According to non-limiting embodiments of the present invention, wet etch selectivity with increasing germanium concentration in silicon is utilized to form a self-aligned boundary between channel sheets and the S/D region, whereby removed layers from the S/D region are replaced by inner spacer layers. The boundaries of different germanium concentration materials are formed by germanium implantation, where the channel is blocked by an existing dummy gate structure, such that the implantation process does not require any additional block lithography process. By introducing at least a 5% germanium concentration difference in a nanosheet layer between the channel and the S/D regions, the etch rate is sufficiently differentiated to form an etch stop that permits removal of S/D portion of the layer up to the channel region, allowing for subsequent inner-spacer fill in the gaps left by the removed portion. For example, a 20% germanium concentration difference can result in an order of magnitude difference in etch rates.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:
1. A semiconductor device, comprising:
a plurality of nanowires in a region formed in a stacked configuration on a semiconductor substrate, wherein the region is defined by outer edges of a gate structure and outer edges of the plurality of nanowires are aligned with the outer edges of the gate structure;
a plurality of channel extension layers extending from an outer edge of the region, each of the plurality of channel extension layers respectively corresponding to and positioned adjacent a nanowire of the plurality of nanowires in the stacked configuration, wherein each of the plurality of channel extension layers has a higher germanium concentration than its corresponding nanowire;
a first spacer layer formed adjacent the outer edge of the region on each of uppermost channel extension layers of the plurality of extension layers; and
a second spacer layer formed adjacent the outer edge of the region under each channel extension layer and under the first spacer layer;
wherein each of the plurality of channel extension layers comprises silicon germanium, wherein silicon comprises a first concentration and germanium comprises the remaining concentration of each of the plurality of channel extension layers;
wherein each corresponding nanowire comprises silicon;
wherein outer edges of the second spacer layers are aligned with outer edges of the plurality of channel extension layers; and
wherein the outer edges of the plurality of channel extension layers are exposed edge surfaces of the plurality of channel extension layers.

2. The semiconductor device according to claim 1, wherein the germanium concentration of each of the plurality of channel extension layers is at least 5% greater than the germanium concentration of its corresponding nanowire.

3. The semiconductor device according to claim 1, wherein the second spacer layer comprises a dielectric.

4. The semiconductor device according to claim 3, wherein the dielectric comprises at least one of silicon oxide, silicon nitride, silicon oxynitride, boron nitride, and silicon boron nitride.

5. The semiconductor device according to claim 1, wherein the stacked configuration comprises a repeating arrangement of a plurality of semiconductor layers.

6. The semiconductor device according to claim 5, wherein the plurality of semiconductor layers comprise silicon.

7. The semiconductor device according to claim 1, wherein each of the plurality of channel extension layers is respectively positioned on a lateral side of its corresponding nanowire.

8. The semiconductor device according to claim 1, wherein each second spacer layer respectively corresponds to and positioned adjacent at least one nanowire of the plurality of nanowires in the stacked configuration.

9. The semiconductor device according to claim 8, wherein each second spacer layer is respectively positioned on lateral and upper or lower sides of the at least one nanowire.

10. A semiconductor device, comprising:
a stacked configuration comprising a repeating arrangement of a plurality of semiconductor layers in a channel region on a semiconductor substrate, wherein the channel region is defined by outer edges of a gate structure and outer edges of the plurality of semiconductor layers are aligned with the outer edges of the gate structure;
a plurality of channel extension layers extending from an outer edge of the channel region, each of the plurality of channel extension layers respectively corresponding to and positioned adjacent a semiconductor layer of the stacked configuration, wherein each of the plurality of channel extension layers has a higher germanium concentration than its corresponding semiconductor layer;
a first spacer layer formed adjacent the outer edge of the channel region on each of uppermost channel extension layers of the plurality of extension layers; and
a second spacer layer formed adjacent the outer edge of the channel region under each channel extension layer and under the first spacer layer;
wherein each of the plurality of channel extension layers comprises silicon germanium, wherein silicon comprises a first concentration and germanium comprises the remaining concentration of each of the plurality of channel extension layers;
wherein each corresponding semiconductor layer comprises silicon;
wherein outer edges of the second spacer layers are aligned with outer edges of the plurality of channel extension layers; and
wherein the outer edges of the plurality of channel extension layers are exposed edge surfaces of the plurality of channel extension layers.

11. The semiconductor device according to claim 10, wherein the germanium concentration of each of the plurality of channel extension layers is at least 5% greater than the germanium concentration of its corresponding semiconductor layer.

12. The semiconductor device according to claim 10, wherein the plurality of semiconductor layers comprise silicon.

13. The semiconductor device according to claim 10, wherein each of the plurality of channel extension layers is respectively positioned on a lateral side of its corresponding semiconductor layer.

14. The semiconductor device according to claim 10, wherein each second spacer layer respectively corresponds to and positioned adjacent at least one semiconductor layer of the stacked configuration.

* * * * *